United States Patent
Maheshwari et al.

(10) Patent No.: US 10,542,457 B2
(45) Date of Patent: Jan. 21, 2020

(54) ENHANCED COMPRESSION FORMATS FOR DATA COMPRESSION

(71) Applicant: QUALCOMM Incorporated, San Diego, CA (US)

(72) Inventors: Shailesh Maheshwari, San Diego, CA (US); Leena Zacharias, San Jose, CA (US); Aziz Gholmieh, Del Mar, CA (US); Srinivasan Balasubramanian, San Diego, CA (US); Vishal Dalmiya, San Diego, CA (US); Ashwini Raina, Sunnyvale, CA (US); Rohit Kapoor, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 274 days.

(21) Appl. No.: 15/095,374

(22) Filed: Apr. 11, 2016

(65) Prior Publication Data

US 2016/0309364 A1    Oct. 20, 2016

Related U.S. Application Data

(60) Provisional application No. 62/149,914, filed on Apr. 20, 2015.

(51) Int. Cl.
*H04W 28/06* (2009.01)
*H04L 29/06* (2006.01)
(Continued)

(52) U.S. Cl.
CPC ............ *H04W 28/06* (2013.01); *H03M 7/30* (2013.01); *H03M 7/4018* (2013.01); *H04L 69/04* (2013.01)

(58) Field of Classification Search
CPC ...... H04W 28/06; H03M 7/4018; H04L 69/04
See application file for complete search history.

(56) References Cited

U.S. PATENT DOCUMENTS

| | | | |
|---|---|---|---|
| 6,788,680 B1 * | 9/2004 | Perlman | H04L 29/06 370/389 |
| 6,804,238 B1 * | 10/2004 | Euget | H04L 29/06 370/392 |

(Continued)

FOREIGN PATENT DOCUMENTS

| | | |
|---|---|---|
| EP | 2469793 A1 | 6/2012 |
| WO | WO-2015034758 A1 | 3/2015 |

OTHER PUBLICATIONS

International Search Report and Written Opinion—PCT/US2016/027138—ISA/EPO—dated Jul. 25, 2016.

*Primary Examiner* — Peter P Chau
(74) *Attorney, Agent, or Firm* — Patterson & Sheridan, LLP

(57) ABSTRACT

Certain aspects of the present disclosure generally relate to wireless communications and, more particularly, to enhanced compression formats for data compression (e.g., uplink data compression (UDC)). A method is provided for wireless communications. The method generally includes determining one or more blocks of data in a current packet matching one or more blocks of data in one or more portions of one or more previous packets stored in a memory, compressing at least a portion of the current packet based on an enhanced compression format having reduced metadata relative to another compression format to indicate one or more of the matching blocks of data, and transmitting the compressed current packet. Numerous other aspects are provided.

17 Claims, 14 Drawing Sheets

(51) Int. Cl.
*H03M 7/40* (2006.01)
*H03M 7/30* (2006.01)

(56) References Cited

U.S. PATENT DOCUMENTS

| | | | |
|---|---|---|---|
| 7,526,607 B1 | 4/2009 | Singh et al. | |
| 2003/0006919 A1 | 1/2003 | Collins et al. | |
| 2005/0083944 A1* | 4/2005 | Liu | H04L 69/04 |
| | | | 370/395.5 |
| 2005/0195750 A1* | 9/2005 | Le | H04L 1/1809 |
| | | | 370/252 |
| 2009/0300296 A1* | 12/2009 | Yasui | H04L 49/90 |
| | | | 711/154 |
| 2012/0327956 A1 | 12/2012 | Vasudevan | |
| 2014/0119377 A1* | 5/2014 | Crosta | H04L 69/04 |
| | | | 370/392 |
| 2014/0169158 A1 | 6/2014 | Mishra et al. | |
| 2014/0189279 A1 | 7/2014 | Seo et al. | |
| 2014/0223029 A1* | 8/2014 | Bhaskar | H03M 7/3088 |
| | | | 709/247 |
| 2014/0223030 A1 | 8/2014 | Bhaskar et al. | |
| 2015/0016475 A1 | 1/2015 | Govindappa et al. | |
| 2015/0063374 A1* | 3/2015 | Venkatachalam Jayaraman | |
| | | | H04L 69/04 |
| | | | 370/476 |
| 2016/0352492 A1* | 12/2016 | De Wit | H04W 24/08 |

* cited by examiner

500

| Packet action (3) = 100 | Checksum (4)=invalid | E(1)=0 |

| ⋮ Mismatched bytes that need to be copied ⋮ |
| ⋮ Remaining bytes ⋮ |

| Packet action (3) | Checksum (4) | E(1)=1 |
|---|---|---|
| Option(2)=01 | E(1)=1 | Lookback length in double words (5) |
| ... (5) | | Number of Mismatches (3) |
| ... (1) | Num of bytes to copy (7) | |
| Matched bytes (6) | | Mismatched bytes (2) |

· · ·

| Match bytes (6) | Mismatched bytes (2) |
|---|---|

Mismatched bytes that needs to be copied according to short header
· · ·

| Option(2)=00 | E(1)=0 | Num matches (5) |
|---|---|---|
| Distance to pointer in bytes (8) | | |
| ... (3) | Lookback length (5) | |
| Lookback length in bytes (8) | | |
| (1) Num Mismatch | Length in bytes (7) | |

· · ·

| Distance to pointer in bytes (8) | |
|---|---|
| ... (3) | Lookback length in bytes (5) |
| ... (8) | |
| ... (1) | Length in bytes (7) |

Mismatched bytes that needs to be copied according to UDC header
· · ·

Remaining bytes
· · ·

| Packet action (3) | | Checksum(4) | E(1)=1 |
|---|---|---|---|
| Option(2)=01 | E(1)=1 | Lookback length in double words (5) | |
| ... (5) | | Number of Mismatches(3) | |
| ... (1) | Num of bytes to copy (7) | | |
| Matched bytes (6) | | | Mismatched bytes (2) |

...

| Match bytes (6) | Mismatched bytes (2) |
|---|---|
| Num matches (8) | |
| Distance to pointer in bytes (8) | |
| ... (3) | Lookback length in bytes (5) |
| ... (8) | |
| ... (1) | Length in bytes (7) |

...

| Distance to pointer in bytes (8) | |
|---|---|
| ... (3) | Lookback length in bytes (5) |
| ... (8) | |
| ... (1) | Length in bytes (7) |

⋮

Mismatched bytes that needs to be copied according to short and UDC headers

⋮

⋮

Remaining bytes

| Packet action (3) | Checksum (4) | | | | |
|---|---|---|---|---|---|
| Option(2)=10 | E(1)=0 | ESubO(1)=1 | Number of References (4) | | E(1)=1 |
| SubO(2) = 10 | ESubO(1)=0 | | Number of Ranges (5) | | |
| Reference Start Index (5) | | | Number of references | | |
| Reference Start Index (5) | | | Number of references | | |
| ... | | | ... | | |
| Mismatched bytes that needs to be copied according to header | | | | | |
| ... | | | | | |
| Remaining bytes | | | | | |

FIG. 8

| Packet action (3) | Checksum (4) | E(1)=1 |
|---|---|---|
| Option(2)=10 | E(1)=0 | Number of References (4) | ESubO(1)=1 |
| SubO(2) = 00 | ESubO(1)=1 | Lookback Offset (5) |
| | Lookback Offset (8) |
| SubO(2) = 10 | ESubO(1)=0 | Number of Ranges (6) |
| Reference Start Index (5) | Number of references |
| ⋮ |
| Reference Start Index (5) | Number of references |
| ⋮ |
| Mismatched bytes that needs to be copied according to header |
| ⋮ |
| Remaining bytes |

| Packet action (3) | | | Checksum (4) | E(1)=1 |
|---|---|---|---|---|
| Option(2)=10 | E(1)=1 | ESubO(1)=1 | Number of References (4) | |
| SubO(2)=10 | ESubO(1)=0 | | Number of Ranges (5) | |
| Reference Start Index (5) | | | Number of references | |

...

| Reference Start Index (5) | | Number of references |
|---|---|---|
| Option(2)=00 | E(1)=1 | Num matches (5) |
| Distance to point in bytes (8) | | |
| ... (3) | | Lookback length in bytes (5) |
| ... (8) | | |
| ... (1) | Length in bytes (7) | |

...

| Option(2)=10 | E(1)=0 | ESubO(1)=1 | Number of References (4) |
|---|---|---|---|
| SubO(2)=10 | ESubO(1)=0 | | Number of Ranges (5) |
| Reference Start Index (5) | | | Number of references |

| Reference Start Index (5) | Number of references |
|---|---|
| ⋮<br>Mismatched bytes that needs to be copied according to header<br>⋮ | |
| ⋮<br>Remaining bytes<br>⋮ | |

FIG. 11

ENHANCED COMPRESSION FORMATS FOR DATA COMPRESSION

CROSS-REFERENCE TO RELATED APPLICATION & PRIORITY CLAIM

This application claims benefit of and priority to U.S. Provisional Patent Application Ser. No. 62/149,914, filed Apr. 20, 2015, which is herein incorporated by reference in its entirety for all applicable purposes.

BACKGROUND

Field of the Disclosure

Certain aspects of the present disclosure generally relate to wireless communications and, more particularly, to enhanced compression formats for data compression (e.g., uplink data compression (UDC)).

Description of Related Art

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and user terminals in a wireless network.

Certain aspects of the present disclosure generally relate to enhanced compression formats for data compression, such as, uplink data compression (UDC).

Certain aspects of the present disclosure provide a method for wireless communications. The method generally includes determining one or more blocks of data in a current packet matching one or more blocks of data in one or more portions of one or more previous packets stored in a memory, compressing at least a portion of the current packet based on an enhanced compression format having reduced metadata relative to another compression format to indicate one or more of the matching blocks of data, and transmitting the compressed current packet.

Certain aspects of the present disclosure provide an apparatus for wireless communications. The apparatus generally includes means for determining one or more blocks of data in a current packet matching one or more blocks of data in one or more portions of one or more previous packets stored in a memory, means for compressing at least a portion of the current packet based on an enhanced compression format having reduced metadata relative to another compression format to indicate one or more of the matching blocks of data, and means for transmitting the compressed current packet.

Certain aspects of the present disclosure provide an apparatus for wireless communications. The apparatus generally includes at least one processor configured to: determine one or more blocks of data in a current packet matching one or more blocks of data in one or more portions of one or more previous packets stored in a memory, compress at least a portion of the current packet based on an enhanced compression format having reduced metadata relative to another compression format to indicate one or more of the matching blocks of data, and output the compressed current packet for transmissions; and a memory coupled with the at least one processor.

Certain aspects of the present disclosure provide a computer readable medium having computer executable code stored thereon. The computer executable code generally includes code for determining one or more blocks of data in a current packet matching one or more blocks of data in one or more portions of one or more previous packets stored in a memory, code for compressing at least a portion of the current packet based on an enhanced compression format having reduced metadata relative to another compression format to indicate one or more of the matching blocks of data, and code for transmitting the compressed current packet.

Numerous other aspects are provided including methods, apparatus, systems, computer program products, and processing systems.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5 illustrates an example enhanced UDC packet format based on Previous-Packet Compression Context Reference (PPCR), in accordance with certain aspects of the present disclosure.

FIG. 7A illustrates another example enhanced UDC packet format based on PMCR and conventional UDC, in accordance with certain aspects of the present disclosure.

FIG. 7B illustrates another example of an enhanced UDC packet format with PMCR and UDC, in accordance with certain aspects of the present disclosure.

FIG. 8 illustrates an example enhanced UDC packet format based on Prior Individual Compression Context Reference (PICR), in accordance with certain aspects of the present disclosure.

FIG. 9 illustrates an example of an enhanced UDC packet format based on PICR with lookback offset, in accordance with certain aspects of the present disclosure.

FIG. 11 illustrates an example of an enhanced UDC packet format with PICR and UDC, in accordance with certain aspects of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
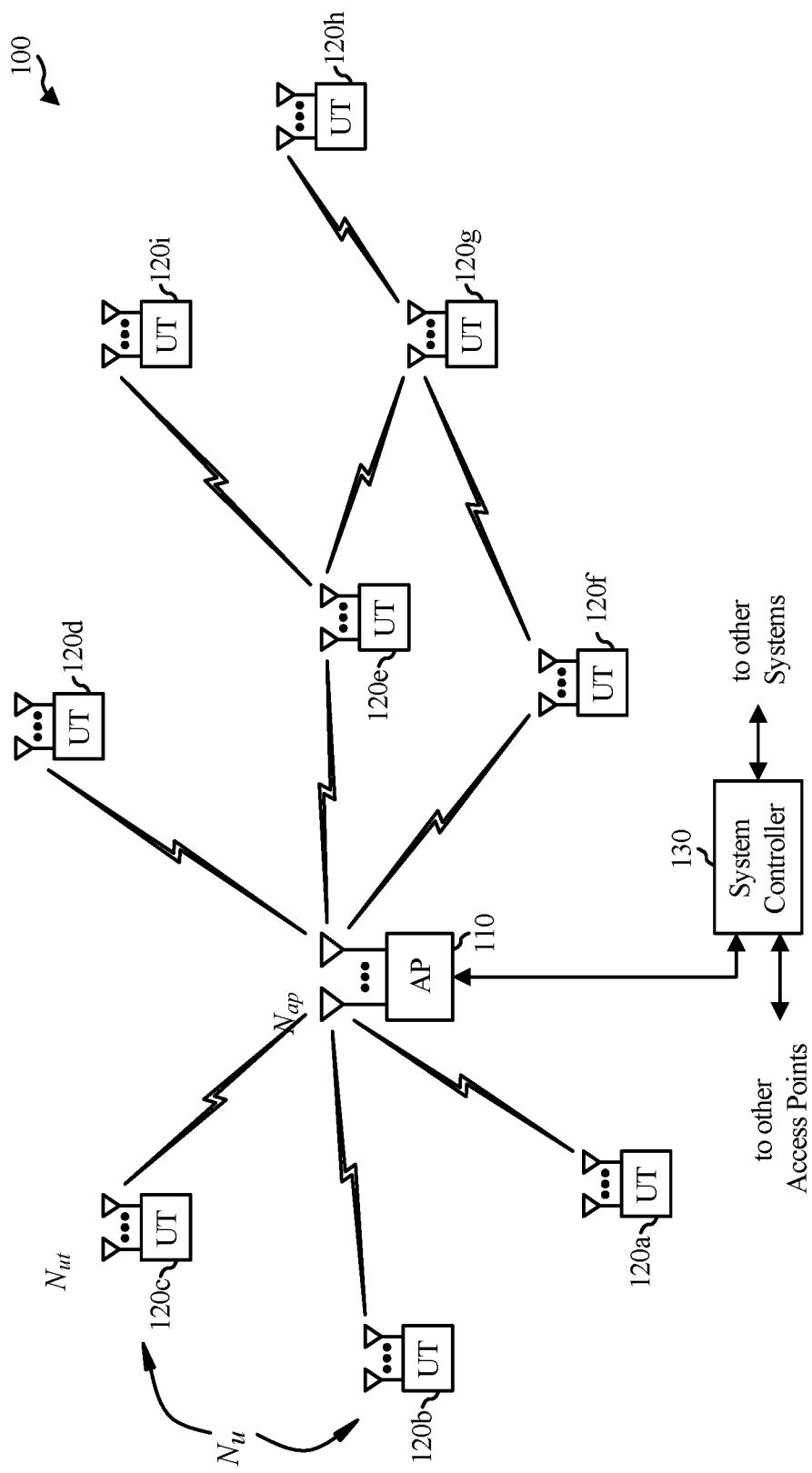
FIG. 1 illustrates a diagram of a wireless communications network, in accordance with certain aspects of the present disclosure.

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of, or combined with, any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect disclosed herein may be embodied by one or more elements of a claim.

Aspects of the present disclosure generally relate to wireless communications and, more particularly, to enhanced compression formats for data compression (e.g., uplink data compression (UDC)). Aspects of the present disclosure provide headers pursuant to enhanced UDC formats that may be reduced in size relative to headers pursuant to other UDC formats. As will be described in more detail herein, one or more blocks of data in a current packet may match one or more blocks of data in one or more portions of one or more previous packets stored in a memory. At least a portion of the current packet may be compressed based on an enhanced UDC format, having reduced metadata relative to another UDC format, to indicate one or more of the matching blocks of data. The enhanced UDC format may use a Short UDC header having a reduced number of metadata or referencing a UDC header, a Short UDC header, or individual metadata of a prior packet. While aspects of this disclosure are discussed for a specific example of UDC, the techniques and formats discussed herein may be applied to other formats and compression techniques.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE), or some other standards. A TDMA system may implement GSM or some other standards. These various standards are known in the art.

An access point ("AP") may comprise, be implemented as, or known as a Node B, Radio Network Controller ("RNC"), evolved Node B (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as a subscriber station, a subscriber unit, a mobile station (MS), a remote station, a remote terminal, a user terminal (UT), a user agent, a user device, user equipment (UE), a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a tablet, a portable communication device, a portable computing device (e.g., a personal data assistant), an entertainment device (e.g., a music or video device, or a satellite radio), a global positioning system (GPS) device, or any other suitable device that is configured to communicate via a wireless or wired medium. In some aspects, the AT may be a wireless node. Such wireless node may provide, for example, connectivity for or to a network (e.g., a wide area network such as the Internet or a cellular network) via a wired or wireless communication link.

An Example Wireless Communication System

FIG. 1 illustrates a system 100 in which aspects of the disclosure may be performed. For example, user terminals 120 may be configured to communicate with the access point 110 by exchanging compressed packets, for example, using a data compression format (e.g., an uplink data compression (UDC) format) or an enhanced data compression format (e.g., an enhanced UDC format). The access point 110 and/or user terminals 120 may store one or more portions (e.g., data and/or metadata) of prior packets in a memory and compare data and/or metadata in a current packet to such stored data/metadata to identify matching blocks of data/metadata. The access point 110 or user terminals 120 may then compress the current packet using a Short UDC header with a reduced number of metadata or referencing a stored UDC header, a stored Short UDC header, or stored individual metadata of a prior packet.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
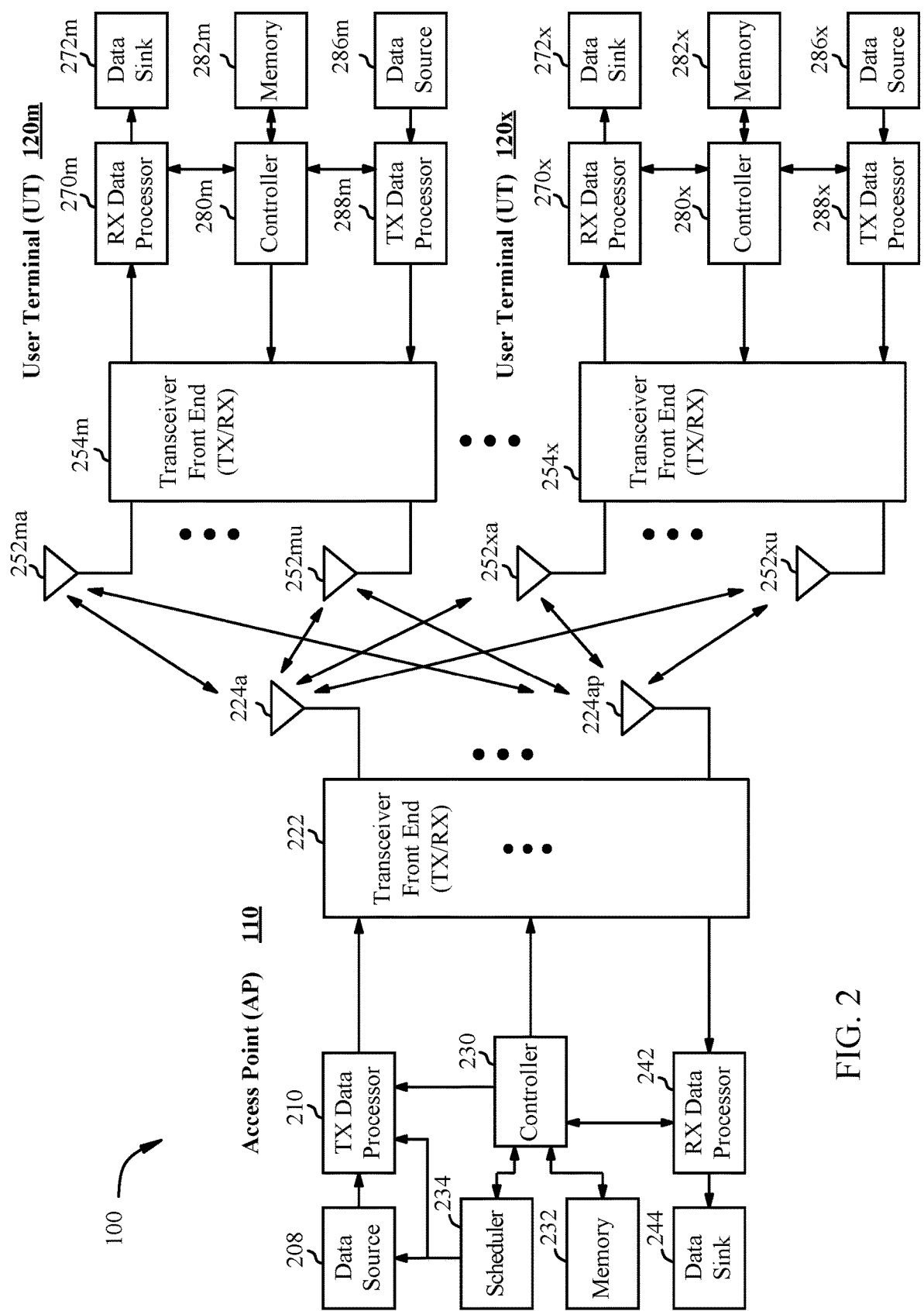
FIG. 2 illustrates a block diagram of an example access point (AP) and user terminals, in accordance with certain aspects of the present disclosure.

FIG. 2 is a block diagram showing components of access point 110 and two user terminals 120m and 120x in wireless system 100, which may be used to implement aspects of the present disclosure. For example, the components may be used to perform the operations 400 described herein, for example, those illustrated with references to FIGS. 4 and 4A. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222.

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. The controller/processor 280 and/or other processors and modules and/or memories 282 at the UE 120 may perform or direct operations for example operations 400 in FIG. 4, and/or other processes for the techniques described herein (e.g., complementary processes on the receive side), for example. The controller/processor 230 and/or other processors and modules and/or memories 232 at the access point 110 may perform or direct operations for example operations 400 in FIG. 4, and/or other processes for the techniques described herein (e.g., complementary processes on the receive side), for example. In aspects, one or more of any of the components shown in FIG. 2 may be employed to perform example operations 400 and/or other processes (e.g., complementary processes on the receive side) for the techniques described herein.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, and combinations thereof.

Example Uplink Data Compression (UDC)

The number of people using Smartphones is increasing globally, resulting in increased data consumption over wireless networks (e.g., such as HSPA or LTE networks). In conjunction with the rise in smartphone usage, is an increase in users' expectations of the quality of service of their smartphones. One way to help ensure better user experience involves over the air data traffic compression.

Uplink data compression (UDC) aims to reduce the size of uplink data packets including, but not limited to, transport control protocol (TCP) headers, user datagram protocol (UDP) headers, Internet protocol (IP) headers, and data fields, for example. In UDC, the user device (e.g., such as user terminal 120) compresses the data, which may then be decompressed at a receiving end, for example, by the radio network controller (RNC).

UDC may enable shorter transmit durations and low transmit power, which in turn may result in reduced interference, system capacity gains, and better user experience.

UDC is performed by compressing packets headers and/or payloads based on prior packets sent. For example, a memory such as an uplink Compression Memory may be employed at both the transmitter and/or receiver side to remember past packets. Looking at the existing memory, repetitive strings in the prior packets may be identified and matched to strings in current packets. Matched blocks of data (e.g., bytes) in the current packet may be replaced with Pointer Metadata that points to a location in the UL Compression Memory of a block of matched bytes.

Figure 3:
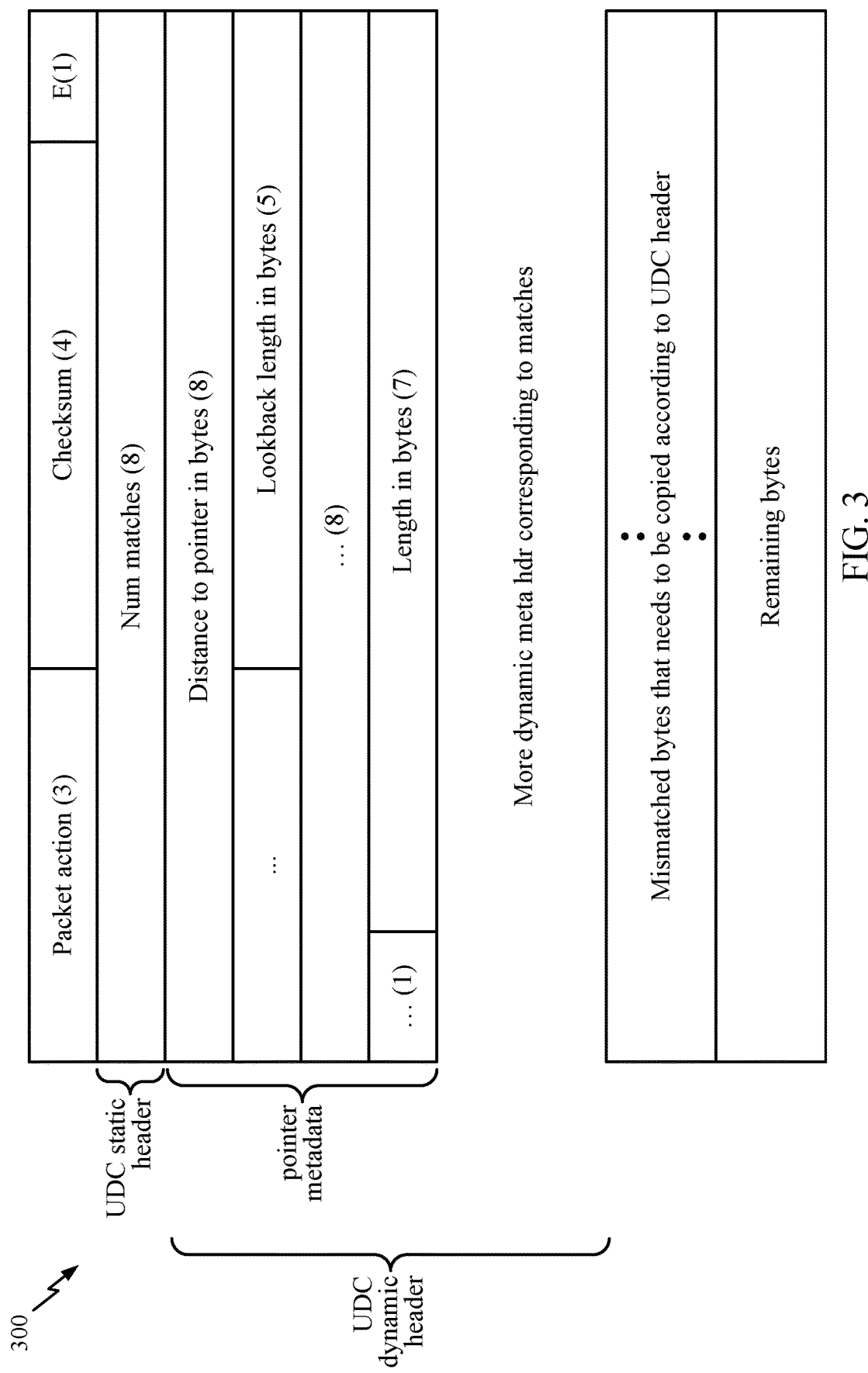
FIG. 3 illustrates an example uplink data compression (UDC) packet format.

FIG. 3 illustrates an example UDC packet format 300. As shown in FIG. 3, the UDC packet format 300 includes a Packet action field, a Checksum field, an Extension field, a UDC static header, a UDC dynamic header, a mismatched bytes field, and a remaining bytes field. The UDC static header includes a Number of matches field. The UDC dynamic header includes pointer metadata for each match being referenced for compression. The pointer metadata includes a Distance to pointer in bytes field, a Lookback length field and a Length in bytes fields.

As shown in FIG. 3, the Packet action field may be the upper 3 bits of the packet header. The values of the 3 bits in the Packet action field can indicate various actions. A value of 011 for the Packet action field indicates full packet compression. In this case, the entire packet is pushed to the UL Compression (Comp) Memory. A value of 010 for the Packet action field indicates Header-only compression. In this cases, only the header is pushed to UL Compression Memory. A value of 100 for the Packet action field indicates Full packet compression, but the packet is not pushed to the UL Compression Memory. In this case, the packet is not pushed to the UL Compression Memory. For the above three Packet action field values (011, 010, and 100), decompression can be performed as indicated by the Number of Matches field and the pointer metadata fields.

A value of 001 for the Packet action field indicates that compression was attempted but no matches were found. In this case, the entire packet is pushed to UL Compression Memory. A value of 000 for the Packet action field indicates no compression was attempted. In this case, the packet is not pushed to UL Compression Memory. A value of 101 for the Packet action field indicate for all bits in the UL Comp Memory to be reset to values of all zeros. In this case, the entire packet is pushed to UL Compression Memory. If the Packet action field is set to any one of these three Packet action values (001, 000, and 101), the Number of Matches and Pointer Metadata fields will not be present.

As shown in FIG. 3, the Checksum field can be 4 bits. The Checksum field is used by the decompressor (e.g., the RNC) to detect UL Compression Memory Out of Sync conditions between the compressor and decompressor. For Packet action field values of 011, 010 and 100, the Checksum field includes the sum of the first 5 bytes of the first match in this packet. For a Packet action field value of 001, the Checksum field includes the sum of the last 5 bytes in the UL Compression Memory before the packet that includes the checksum is pushed into the UL Compression Memory. For a Packet action field value of 000, the checksum bits are invalid and may not be checked. For a Packet action field value of 101, the checksum bits can be set to all zeros.

As shown in FIG. 3, the Extension (E) field can be the next 1 bit and can be reserved for extensions to the header. Typically, this bit is set to 0. However, as will described in more detail below, according to the techniques described herein, this bit may be set to 1 to indicate the proposed formats pursuant to enhanced data compression.

As shown in FIG. 3, the Number of matches field can be an 8 bit field in the UDC static header portion of the packet format 300. The Number of matches field indicates the number of pointer metadata present in the packet. For example, the Number of matches field can indicate up to 255 compressed blocks present in a single compressed packet.

As mentioned above, the Pointer metadata portion of the dynamic UDC header includes Distance to Pointer, Lookback Length, and Length fields. Each Pointer metadata identifies a compressed block within the packet.

As shown in FIG. 3, the Distance to Pointer field can be 11 bits. The Distance to point field can indicate the length in bytes of the distance to the previous uncompressed block before this compressed block that is being referenced by the metadata. The distance can cover a packet size up to 2048 bytes, thus, valid values for this field can represent, translate to, or otherwise be interpreted as a range from 0 to 2047 with a value of 0 indicating that there are no uncompressed bytes that precede this compressed block.

As shown in FIG. 3, the Lookback Length field can be 14 bits. The Lookback Length field can indicate the distance in bytes to look back in UL Compression Memory from the current end of UL Compression Memory to find the replacement for the compressed block. For example, the lookback length can reference a UL Compression Memory capacity up to 16 kB, thus, the valid values for this field can represent, translate to or otherwise be interpreted as a range from 4 to 16383 (e.g., a value of 4 means that the match occurred with the last 5 bytes in UL Compression Memory).

As shown in FIG. 3, the Length field can be 7 bits. The Length field can indicate the number of bytes to copy from UL Compression Memory. The match length is interpreted as the indicated length in the field, plus a minimum match length, which may be 5 bytes. The number of bytes to be copied can be as large as 132 bytes (e.g., $2^7+5$).

For example, thus, the Distance to pointer field can be used to determine the location of where the stored data is to be replaced, the Lookback length field can be used to find the location of the stored matched data bytes, and the length field can be used to determine the size of the matched block being referenced.

As mentioned above, UDC is performed by compressing a current packet based on prior packets sent. However, in the case of uplink, the size of one or more portions of the header portion of the packet (e.g., the amount of metadata used for the UDC header(s)) may be substantial relative to the size of payload portion of the packet (e.g., compressed packet). Particularly when there are a significant number of matches and multiple UDC headers are used. For example, as shown in FIG. 3, the pointer metadata in the UDC dynamic header is 4 bytes (e.g., 32 bits) for each matched block being referenced. Thus for N matched blocks, the UDC header size is N×4 bytes. A typical uplink packet may be about 50 bytes, for example. Thus, the UDC header size may be significant relative to the packet size.

Thus, techniques and apparatus for reducing the amount of metadata used for UDC compression headers are desirable to improve data compression (e.g., realize further compression gains).

In aspects, by reducing the size of a compression header by using an enhanced compression format, compression is improved. As will be discussed in more detail below, UDC compression may be enhanced by using techniques that involve shorter UDC headers and/or by referencing stored previous UDC headers (e.g., referencing stored metadata, not just stored uncompressed data), which may allow for compression without any UDC headers.

Example Enhanced Compression Formats for Data Compression

Techniques and apparatus are provided herein for enhanced compression formats for data compression (e.g., uplink data compression (UDC)). For example, eleven new compression formats are proposed herein to enhance UDC. The formats may reduce the metadata used in compressed UDC packets by eliminating UDC headers or by using shorter UDC headers. The formats may include combinations of various techniques which will be discussed in more detail below. The techniques may include remembering and referencing past UDC headers, using shorter UDC headers (e.g., less metadata), and variations and/or combinations of these techniques. The various techniques and formats may have applicability to various scenarios based on the matching of the current packets and the stored packets, for example, based on whether there are many or fewer matches, clustered or spaced apart matches, etc. Thus, the various formats may be employed dynamically, for example, based on pattern-matching of the current and previous packets. Additionally, any of the enhanced UDC compression formats may be used in combination with UDC.

Figure 4:
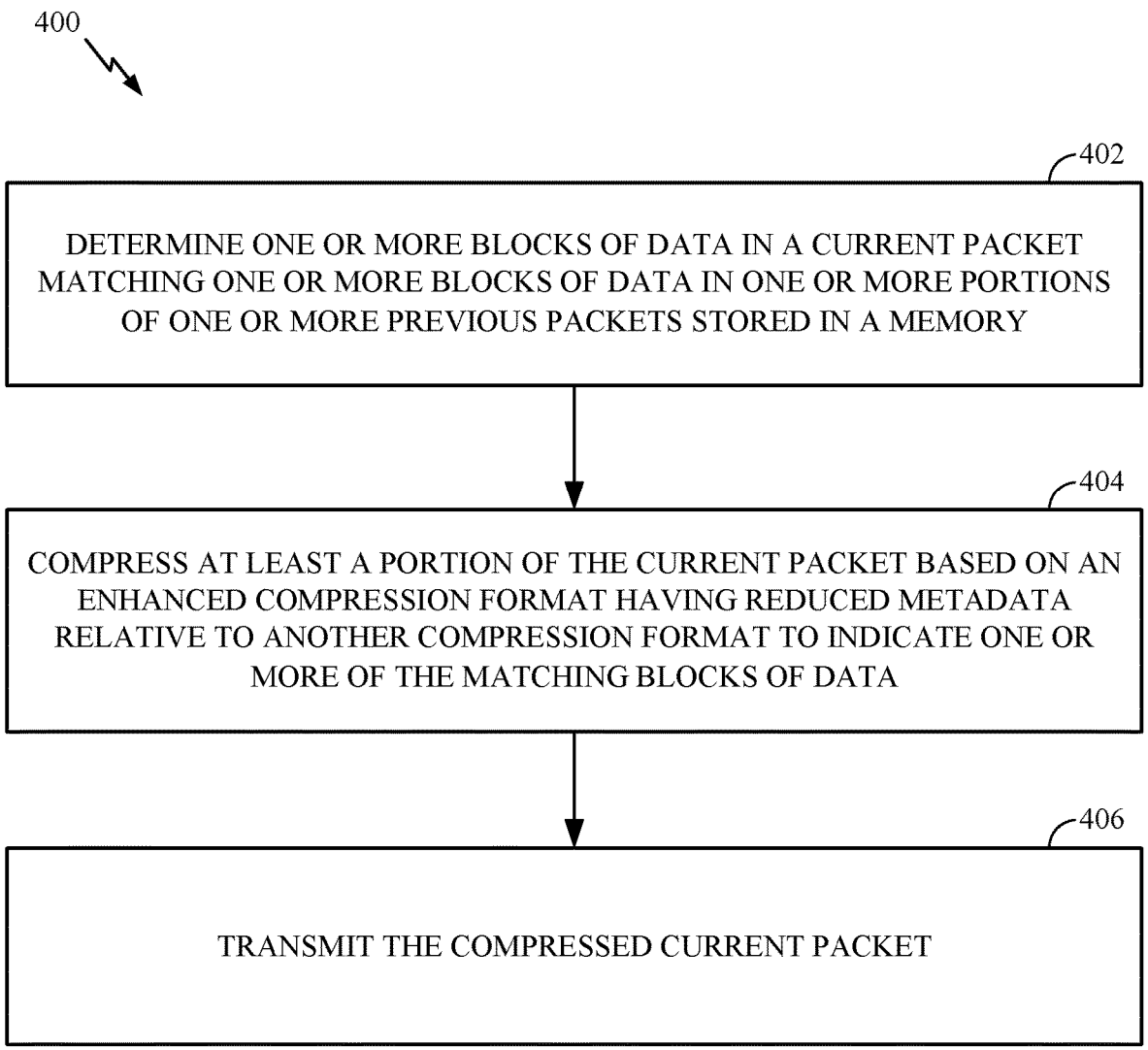
FIG. 4 is a flow diagram of example operations for wireless communications, in accordance with certain aspects of the present disclosure.
Figure 4A:
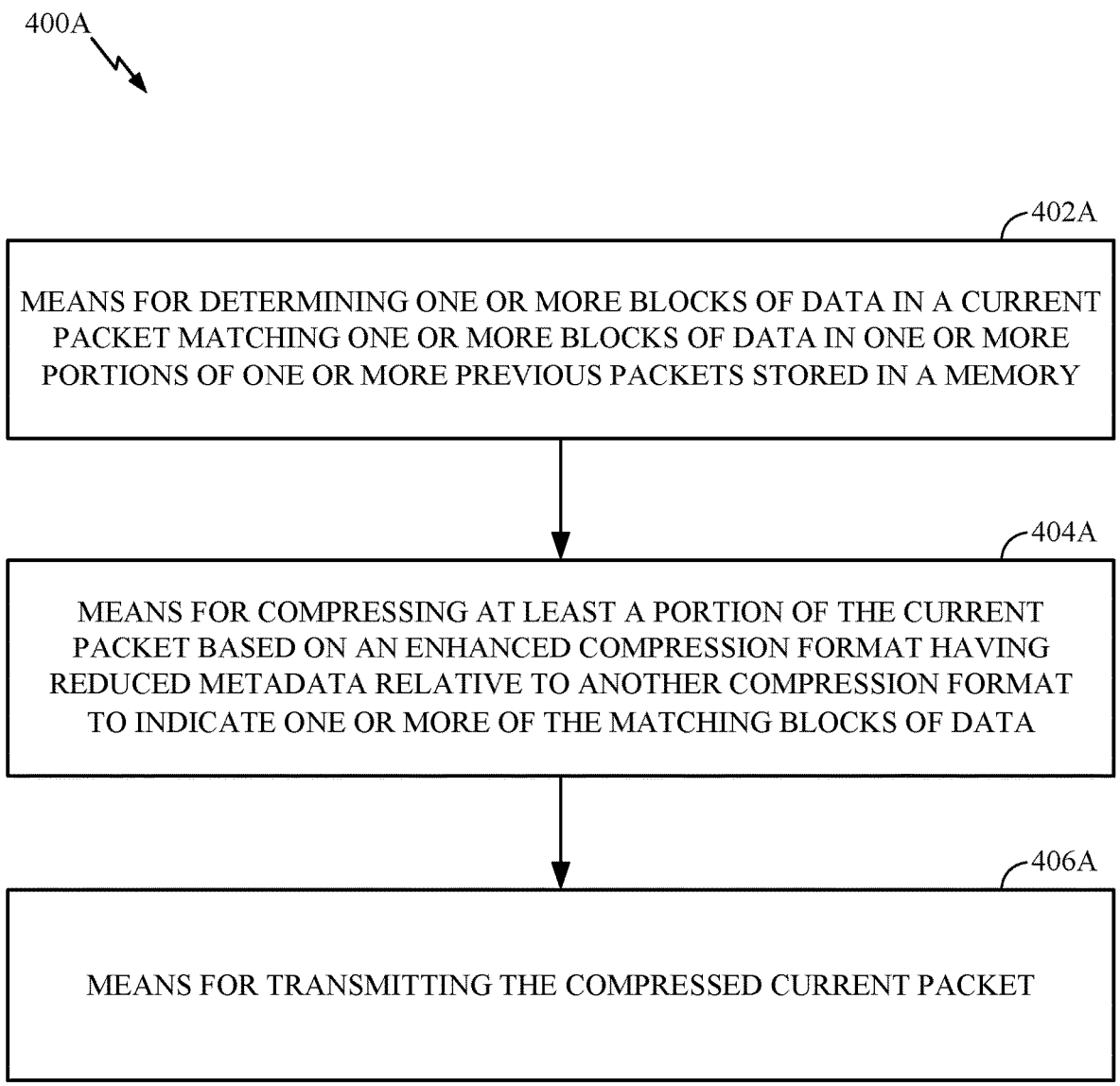
FIG. 4A illustrates example means capable of performing the operations shown in FIG. 4.

FIG. 4 is a flow diagram of example operations 400 for wireless communications, in accordance with certain aspects of the present disclosure. The operations 400 may be performed, for example, by a sender (e.g., user terminal 120 or access point 110) of a packet. The operations 400 may begin, at 402, by determining one or more blocks of data in a current packet matching one or more blocks of data in one or more portions of one or more previous packets (e.g., the immediately preceding packet or any other prior packet) stored in a memory.

At 404, the sender may compress at least a portion of the current packet based on (e.g., using) an enhanced compression format (e.g., enhanced UDC) having reduced metadata relative to another compression format (e.g., UDC) to indicate one or more of the matching blocks of data. Another portion of the current packet may be compressed using another enhanced compression format or using the other compression format. According to certain aspects, compressing the portion of the current packet based on the enhanced compression format may include referencing a stored compression header, short compression header, template ID, and/or an index to individual metadata in the compressed current packet. According to certain aspects, compressing the portion of the current packet based on the enhanced compression format may include using a short compression header in the compressed current packet. A static portion of the short compression header may indicate, for one or more the matching blocks of data, a lookback location in a memory common to each of the matching blocks of data, a Number of bytes to copy from the lookback location and a number of mismatched data in the copied block, and a dynamic portion that indicates a size of a block of matching and mismatching data.

At 406, the sender may transmit the compressed current packet (e.g., to a receiver). In aspects, the present methods and apparatus include complementary methods and apparatus on the receive side. In such aspects, one or more blocks of data in one or more portions of one or more previous packets (e.g., the immediately preceding packet or any other prior packet) may be stored in a memory, and such data may be employed to decode and/or reassemble such packets after receipt, for example. In aspects, the data stored in memory on the transmit side in step 402 may also be provided to or obtained, and stored on the receive side.

Example Enhanced UDC Compression Techniques Using Reference in Current UDC Packet to UDC Header of a Previous Packet As mentioned above, compression gains may be achieved by storing not only one or more previous packets, but also storing (e.g., in UL Compression memory) one or more UDC headers of previous packets and referring to such stored UDC headers in a current compressed UDC packet. In other words, storing metadata as well as, or instead of, storing data. A current compressed packet can use pointers to the stored UDC headers/metadata.

An enhanced UDC packet format may employ different values for the Packet Action field, Checksum field, and/or Extension field than used by the conventional UDC packet format, for example, described above with respect to FIG. 3. These fields and values may be applicable to various of the enhanced compression format provided in this disclosure and are discussed in greater detail below with respect to the various enhanced formats.

Values of bits in an Option field may be used to indicate the type of header being employed in the current packet. For example, values 00 in the Option field may indicate that the header in the current packet is a UDC header, values 01 in the Option field may indicate the header in the current packet is a Short UDC header (the format of the Short UDC header is described in more detail below), values 10 in the Option field may indicate a that the header in the current packet is a prior individual compression context reference (PICR) header (the format of the PICR is discussed in more detail below), and values 11 in the Option field may indicate a push header. According to certain aspects, other values may be used in the Options field to indicate these or other headers.

In an enhanced UDC packet format as described herein, the packet action field (e.g., the upper 3 bits), can be used to indicate actions for the packet. If compression is not used for the packet, bits in the Packet action field may be set to values (e.g., 000 or 001) to indicate that no compression is used for the packet and no headers are present in the packet. In one example, a value of the Packet action field (e.g., bit values of 000) may indicate that the packet is not pushed to UL Compression Memory. In another example, a value of the Packet action field (e.g., bit values of 001) may indicate that the entire packet is pushed to UL Compression Memory. A values of the Packet action field (e.g., bit values of 010) may indicate header only compression. In this case, only the header is copied to UL Compression Memory as indicated by udcHeaderLength field. Values in the Packet action field (e.g., 011) may indicate full packet compression. In this case, the full packet is copied to UL Compression Memory. Values in the Packet action field (e.g., 100) may indicate Exact match with previous header. In this case, the full packet or header only is pushed to memory based on previous packet action. In the cases of Packet action field of 010, 011, and 100, decompression is performed as indicated in the headers. Values in the Packet action field (e.g., 101) may indicate the UL Compression Memory should be reset to all zeros. In this case, the entire packet is pushed to the UL Compression Memory and no headers are present in the compressed current packet.

The Checksum field in the enhanced UDC packet format may be used by the decompressor (e.g., a device that receives the compressed packet) to detect UL Compression Memory out-of-sync conditions between the compressor and decompressor. If the Packet action field value indicates header only compression (e.g., bit values of 010) or full packet compression (e.g., bit values of 011), the Checksum field may include the sum of the first 5 bytes, for example, of the first match referenced in the current packet if the match is indicated in a UDC header. If the first match is indicated in a short header, then the Checksum field value may include the sum of the the of the length of the match or 5 bytes (min(first Match length, 5 bytes)). If first Match length=0, then the value of the Checksum field is zero. If the Packet action field value indicates exact match with previous header (e.g., bit values of 100), the same checksum bits from a previous header may be used and the current checksum bits are invalid. If the Packet action field value indicates no compression (e.g., bit values of 001), the Checksum field may include the sum of the last 5 bytes, for example, in the UL Compression Memory before the current packet that includes the checksum is pushed into the UL Compression Memory. If the Packet action field value indicates no compression (e.g., bit values of 000), the checksum bits are invalid and may not be checked. If the Packet action field value indicates reset UL Compression Memory to zeros (e.g., bit values of 101), the checksum bits may be set to all zeros.

The Extension (E) field in the enhanced UDC packet format may indicate Extensions to the header. For example, the Extension field may be set to 1 to indicate the presence of a header extension, such as a UDC header or a short UDC header.

According to certain aspects, in the description herein and in the figures, although the various fields of the enhanced compression packet format may be described or illustrated with a particular size (e.g., bits), the size of any of the fields in the packet may vary. In other words, different combinations of bit sizes of the fields may be used in the enhanced UDC packet format.

According to certain aspects, the formats described above for the Option field, the Packet action field, the Checksum field, and the Extension field may be applicable to any of the enhanced packet compression formats described below.

Example Previous-Packet Compression Context Reference

According to certain aspects, a technique that may be used for the enhanced UDC formats is Previous-Packet Compression Context Reference (PPCR). For PPCR, UDC headers of the previous packet (e.g., transmitted or received) may be stored in memory (e.g., in an UL Compression Memory). The current packet may include a reference to a stored UDC header of the previous packet (e.g., the packet immediately preceding the current packet). For example, a stored UDC header that points to data blocks matching data blocks of the current packet can be referenced, thus, the UDC header in the current packet matches or partially matches the stored UDC header.

According to certain aspects, for a full match of the stored UDC header to data blocks in the current packet, an indication may be included in the compressed current packet, for example in the Packet action field. Thus, the packet may not include a UDC header. FIG. 5 illustrates an example enhanced UDC packet format 500 based on PPCR, in accordance with certain aspects of the present disclosure. As shown in FIG. 5, the packet format 500 indicates a full match (100) in the Packet action field indicating to the receiver that the UDC header from a previous packet is to be reused for the current packet and, thus, the packet format 500 does not include any UDC header.

According to certain aspects, for a partial match, the matching UDC header may be referenced in the compressed current packet; however, a UDC header, such as illustrated in FIG. 3 may be used to reference remaining unmatched data.

Example Multi-Packet Compression Context Reference

According to certain aspects, another technique that may be used for the enhanced UDC format is Multi-Packet Compression Context Reference (MPCR). MPCR may be similar to PPCR; however, UDC headers (e.g., of UDC or enhanced UDC) from any prior packet—not just the immediately preceding packet—may be used for comparison and referencing.

According to certain aspects, an identification (e.g., template ID) may be assigned to the stored UDC headers (e.g., UDC headers or enhanced UDC headers) of previous packets. In this case, the template ID for a corresponding stored UDC header being referenced in the compressed current packet may be used to refer to the UDC header.

According to certain aspects, the PPCR and MPCR techniques described above may be used in combination with any of the Short UDC header techniques which will be described in more detail below, and/or in combination with conventional UDC header techniques. For example, Short UDC headers from the previous packet or from any stored previous packet may also be stored and referenced in the compressed current packet.

Example Enhanced UDC Compression Techniques Using Short UDC Headers

As mentioned above, compression gains may alternatively or additional be achieved by using Short UDC headers. According to certain aspects, as used herein, a Short UDC header may refer to a UDC header that uses less bytes of pointer metadata for each matching block of data to be referenced than existing (e.g., conventional) UDC headers (e.g., less than 4 bytes—as used for conventional UDC header) such as the UDC header illustrated in FIG. 3.

Example Packet Match Compressed Reference

Figure 6:
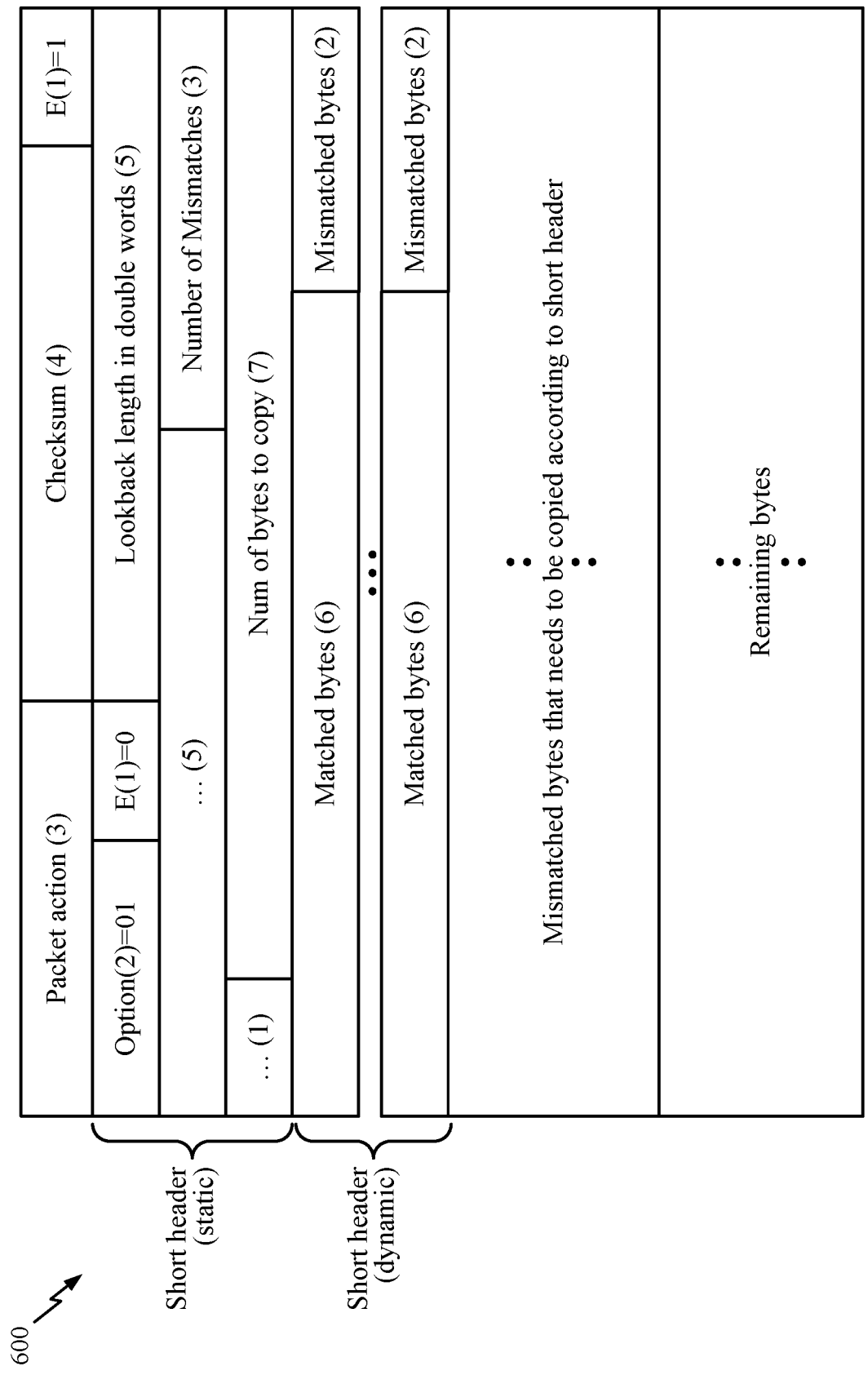
FIG. 6 illustrates an example enhanced UDC packet format based on Packet-Matched Compressed Context Reference (PMCR), in accordance with certain aspects of the present disclosure.

According to certain aspects, a technique that may be used for the enhanced UDC formats is Packet Match Compressed Reference (PMCR). For PMCR, the compressed current packet may refer to any previous packet as a template and further indicate mismatches. FIG. 6 illustrates an example enhanced UDC packet format 600 based on PMCR, in accordance with certain aspects of the present disclosure.

For PMCR, the lookback length may not be indicated for each match. Instead, the compressed current packet may include a Short UDC header with pointer metadata that points to the beginning of the previous packet data in the UL Compression memory as a common lookback length for all matches (e.g., since all of the matches are in the same previous packet). For example, as shown in FIG. 6, the enhanced UDC packet format 600 includes the Lookback fields (e.g., the Lookback length in double words) in the static short header portion rather than in the dynamic UDC header. According to certain aspects, a template ID may also be assigned for prior packets and the compressed current packet may include the corresponding template ID of the prior packet being used as the template.

According to certain aspects, matching and mismatching sequences may be indicated with respect to the common lookback length in the dynamic Short UDC header portion. For example, the Short UDC header metadata may indicate a pair of matched and mismatched bytes with respect to the common lookback length. As shown in the FIG. 6, the enhanced UDC packet format 600 may include a dynamic portion of the short UDC header that is only 1 byte (e.g., the 6-bit Matched bytes field and the 2 bit Mismatched bytes field, for example) for each matched block of data being referenced.

As shown in FIG. 6, the enhanced UDC packet format 600 may include an Option field that indicates the header type (e.g., a value of 01 may indicate PMCR). The UDC packet format 600 may include the Extension field set to 1 to indicate the presence of the Option field.

As mentioned above, the static Short header portion of the enhanced UDC packet format 600 includes the Lookback Length field. The Lookback Length field may indicate the distance in double words (e.g., multiples of 8) to look back in the UL Compression Memory from the current end of UL Compression Memory to find the starting point to copy. The distance in bytes may be equal to Lookback length×8. The packets are aligned to 8 byte (double word) boundaries when pushed to memory. The valid values for the Lookback Length field may represent, translate to, or otherwise be interpreted as a range from 0 to 1023. The static Short header portion may also include a Number of bytes to copy field that indicates the number of bytes to copy from UL Compression Memory which includes matched and mismatched bytes. Valid values for the Number of bytes to copy field may represent, translate to, or otherwise be interpreted as a range from 0 to 127. The static Short header portion may also include a Number of Mismatches field that indicates the number of dynamic Short UDC headers present in the packet (e.g., the number of matched data blocks being referenced). Valid values for the Number of Mismatches field may represent, translate to, or otherwise be interpreted as a range from 0 to 15.

As mentioned above, the dynamic Short header portion of the enhanced UDC packet format 600 includes the Matched byte (e.g., or Matched Length) field that indicates the length in bytes of the matched block before the next mismatched block up to packet size of 63 bytes. Thus, valid values for the Matched byte field may represent, translate to or otherwise be interpreted as a range from 0-63 with a value representing 0 indicating that there are not matched bytes that precede this mismatched block. The dynamic Short header portion of the enhanced UDC packet format 600 also includes the Mismatched bytes field that indicated the length in bytes of the mismatched block following the a matched block up to a packet size of 3 bytes. Thus, valid values for the Mismatched bytes field may represent, translate to or otherwise be interpreted as a range from 0 to 3 with a value representing 0 indicating that there are no mismatched bytes that follow this matched block. Although the lengths of the above fields are shown in FIG. 6 as 6 bits and 2 bits, respectively, other combinations are lengths may be used (e.g., 5 bits and 3 bits, respectively). According to certain aspects, the dynamic Short UDC header is repeated for each matched block of data being referenced. According to certain aspects, header field lengths are exemplary, and a larger or smaller length may be employed for any header field.

The PMCR technique may be beneficial for headers, where only a few fields change from packet to packet. However, this is only example of where PMCR techniques may be useful and PMCR may be used for compressing any other part of the packet as well or alternatively. According to certain aspects, the template approach may be used for the first n bytes, and UDC may be used for the remaining part of the packet with Pointer Metadata indicating each match in the UL Compression Memory.

According to certain aspects, reference may be made to a stored Short UDC header of the immediately preceding previous packet (e.g., PMCR+PPCR) or from any previous packet (e.g., PMCR+MPCR).

According to certain aspects, enhanced compression formats may use Short UDC header techniques (e.g., PMCR) in combination with conventional UDC headers.

Figure 7:
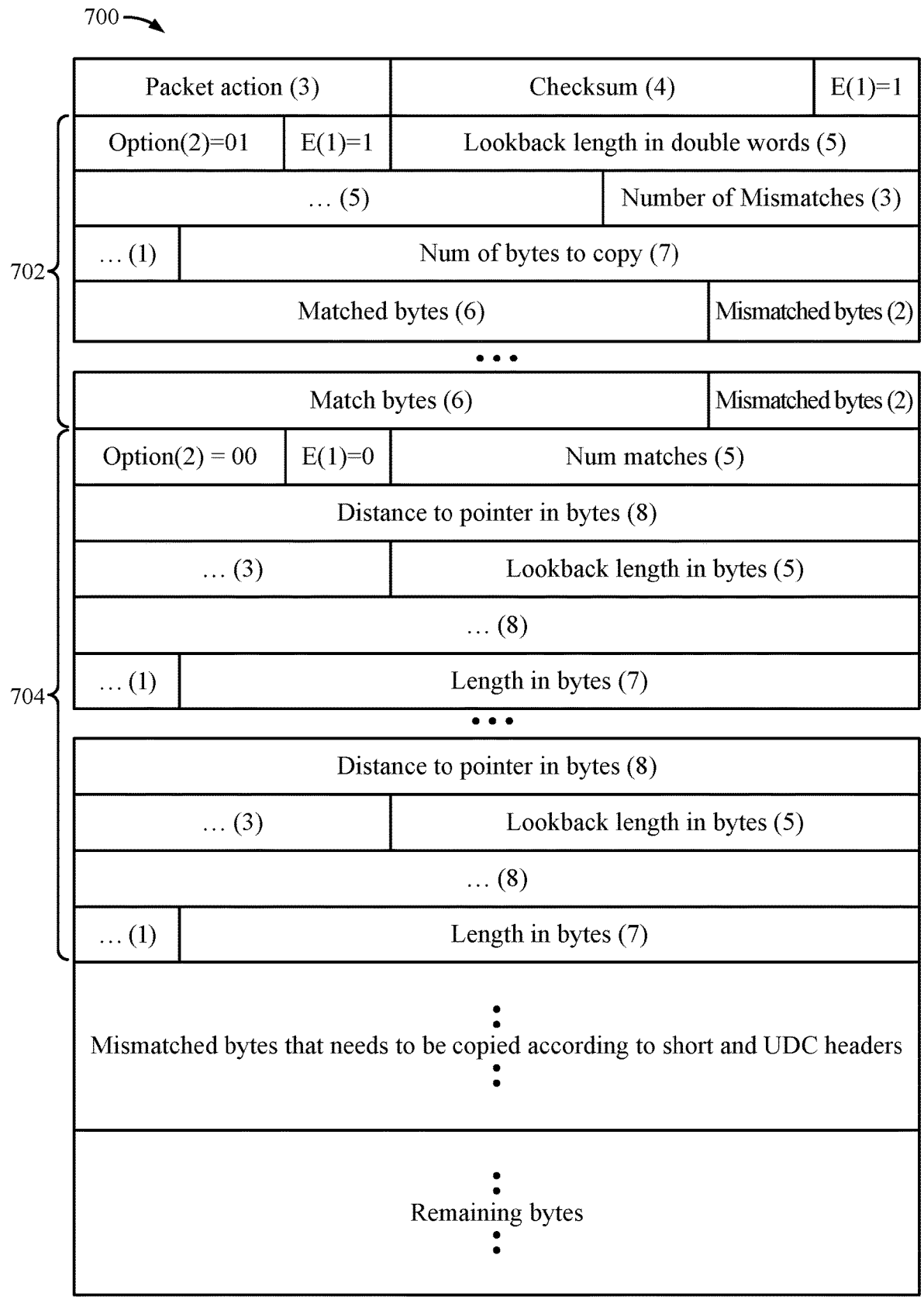
FIG. 7 illustrates an example enhanced UDC packet format based on PMCR and conventional UDC, in accordance with certain aspects of the present disclosure.

FIG. 7 illustrates an example of an enhanced UDC packet format 700 based on PMCR and conventional UDC, in accordance with certain aspects of the present disclosure. As shown in FIG. 7, the enhanced UDC packet format 700 may include both Short PMCR header(s) 702 and conventional UDC header(s) 704. The enhanced UDC packet format 700 may have Option fields to indicate the header types (e.g., a value of 00 may indicate the UDC header and a value of 01 may indicate the Short UDC header). The UDC header may be indicated as an extension to the Short UDC header. In other words, the conventional UDC header may come after the Short UDC header in the compressed current packet. Mismatched bytes fields may be included after the UDC header and may be in the same order as indicated by respective headers. Alternatively, the Mismatched bytes field may be included immediately after each header as shown in FIG. 7A.

FIG. 7B illustrates another example of an enhanced UDC packet format 700B with PMCR and UDC, in accordance with certain aspects of the present disclosure. As shown in FIG. 7B, the PMCR header in this case includes an Option field and an Extended field set to a value of 1 to indicate the presence of a UDC header, which is the only header that may follow. According to certain aspects, the UDC header does not include these fields. Such a special case of header format may be used when the enhanced formats allow UDC header with one other type of header. UDC header is always present as the last header, along with one other type of header preceding it. In this case, the E field in the short header indicates the presence or absence of the UDC header. Similarly, PICR or push headers may precede the UDC header when used in combination with either of those formats.

Example Prior Individual Compression Context Reference

According to certain aspects, a technique that may be used for the enhanced UDC formats is Prior Individual Compression Context (PICR). FIG. 8 illustrates an example enhanced UDC packet format 800 based on PICR, in accordance with certain aspects of the present disclosure. For PICR, individual UDC metadata of previous UDC packets (e.g., transmitter and/or received) may be stored, compared to the current packet, and referenced in the compressed current packet.

According to certain aspects, the stored metadata may be indexed (e.g., at the transmitter and receiver side). The maximum indexing capability may be configurable (e.g., metadata for the past n packets or x number of metadata may be stored/indexed). Thus, when the same metadata is encountered again (e.g., when compared, metadata of the current packet matches stored/indexed metadata), the corresponding index to the stored metadata may be sent (e.g., indicated in the packet), rather than sending the metadata. For example, if the first n indices match, only n needs to be indicated. Alternatively, for partial matches of UDC metadata followed by mismatches, ranges of indices may be indicated in the compressed current packet for the matches, and full 4-byte metadata (e.g., conventional UDC headers) may be used to indicate the mismatches.

As shown in FIG. 8, the enhanced UDC packet format 800 may include an Extension field which may be set to 1 to indicate a following Option field that indicates the header type (e.g., a value of 10 may indicate PICR). Another Extension field may be set to 0 to indicate no additional Option fields. The Number of references field may indicate the number of past metadata indices to be used from a previous packet. An Extension Suboptions (ESubO) field may indicate whether any other suboptions follow. For example, the ESubO field may be set to 1 to indicate the SubOption 10 with Number of ranges field that follows. Valid values for the Number of References field may represent, translate to, or otherwise be interpreted as a range from 0 to 15 (matches are the first zero to number of references minus one indices in the previous packet if number of reference field has value greater than 0).

The Number of Ranges field may indicate the number of ranges of indices that match from previous packet minus one. Valid values for the number of ranges field range from 0 to 31 to indicate the number of 'reference start index, Number of references' pairs which follow for each matching block of data to be referenced. The Reference Start Index may include the metadata index from which the current packet should start using. Valid values for the Reference Start Index may represent, translate to or otherwise be interpreted as a range from 0 to 31. The Number of references field indicates the number of metadata to use starting from index indicated in the Reference Start Index minus 1. Valid values for the Number of references field may represent, translate to, or otherwise be interpreted as a range from 0 to 7. In the case of the first n matches, SubO=10 extension may not be present.

According to certain aspects, the PICR technique may be used in combination with other compression techniques such, for example, conventional UDC (e.g., UDC+PICR), PPCR (e.g., metadata from the previous packet is stored, compared to the current packet, and referenced in the compressed current packet), MPCR (e.g., metadata from any previous packet is stored, compared to the current packet, and referenced in the compressed current packet), or PMCR (e.g., PMCR+PICR; which is discussed in more detail below).

Example PMCR and PICR

As mentioned above, the PMCR technique and PICR may be used in combination for enhanced compression formatting. For example, individual metadata (e.g., PICR technique) from previous Short UDC headers (e.g., PMCR technique) and/or individual metadata from previous conventional UDC headers may be stored, compared to the current packet, and referenced in the compressed current packet. According to certain aspects, the previous UDC header or short UDC header may be from the previous packet (e.g., PPCR) or any prior packet (e.g., MPCR).

According to certain aspects, for metadata related to a conventional UDC header, only metadata from the dynamic portion of the UDC header may be saved. For metadata related to a Short UDC header, both the static portion and the dynamic portion of the Short UDC header may be saved, since the dynamic parts are in reference to the static part. The saved metadata may be tagged individually as related to a Short UDC header or a conventional UDC header, so that the saved metadata can be distinguished when they are referred to in a later packet. Alternatively, the metadata related to the conventional UDC header and the Short UDC header of previous packets may be separately index (e.g., one index for the UDC metadata and another index for the short metadata) in order to distinguish the metadata.

According to certain aspects, a partial match of metadata from a previous packet may be provided as a certain number of bytes to be copied from the previous packet. This may be indicated by a special packet action which asks receiver to copy a certain number of bytes from the previous header and copy the remaining bytes from the current packet to constitute the full header.

Example Enhancement(s)

Metadata for both conventional UDC headers and Short UDC headers includes lookback length which may change upon a new packet getting pushed to memory. According to certain aspects, once a packet is pushed into the memory, all saved pointers may be updated accordingly (e.g., the Lookback length fields) such that matches stay in absolute place. In this case, for any of the above-described techniques the compressed current packet may include an absolute pointer instead of pointer relative to the end of the current memory.

Alternatively, the compressed current packet may include a lookback offset to be applied to the included past references, to compensate for changes to the lookback length when a new packet is stored. FIG. 9 illustrates an example of an enhanced UDC packet format 900 based on PICR with lookback offset, in accordance with certain aspects of the present disclosure. As shown in FIG. 9, the enhanced UDC packet format 900 may include a Suboption field to indicate presence of a Lookback Offset field (e.g., a value of 00). The Lookback Offset field may be added to all Lookback Length field in the metadata that are referred to from the previous packet minus 1. Valid values for the Lookback Offset field may represent, translate to, or otherwise be interpreted as a range from 0 to 8191.

Figure 10:
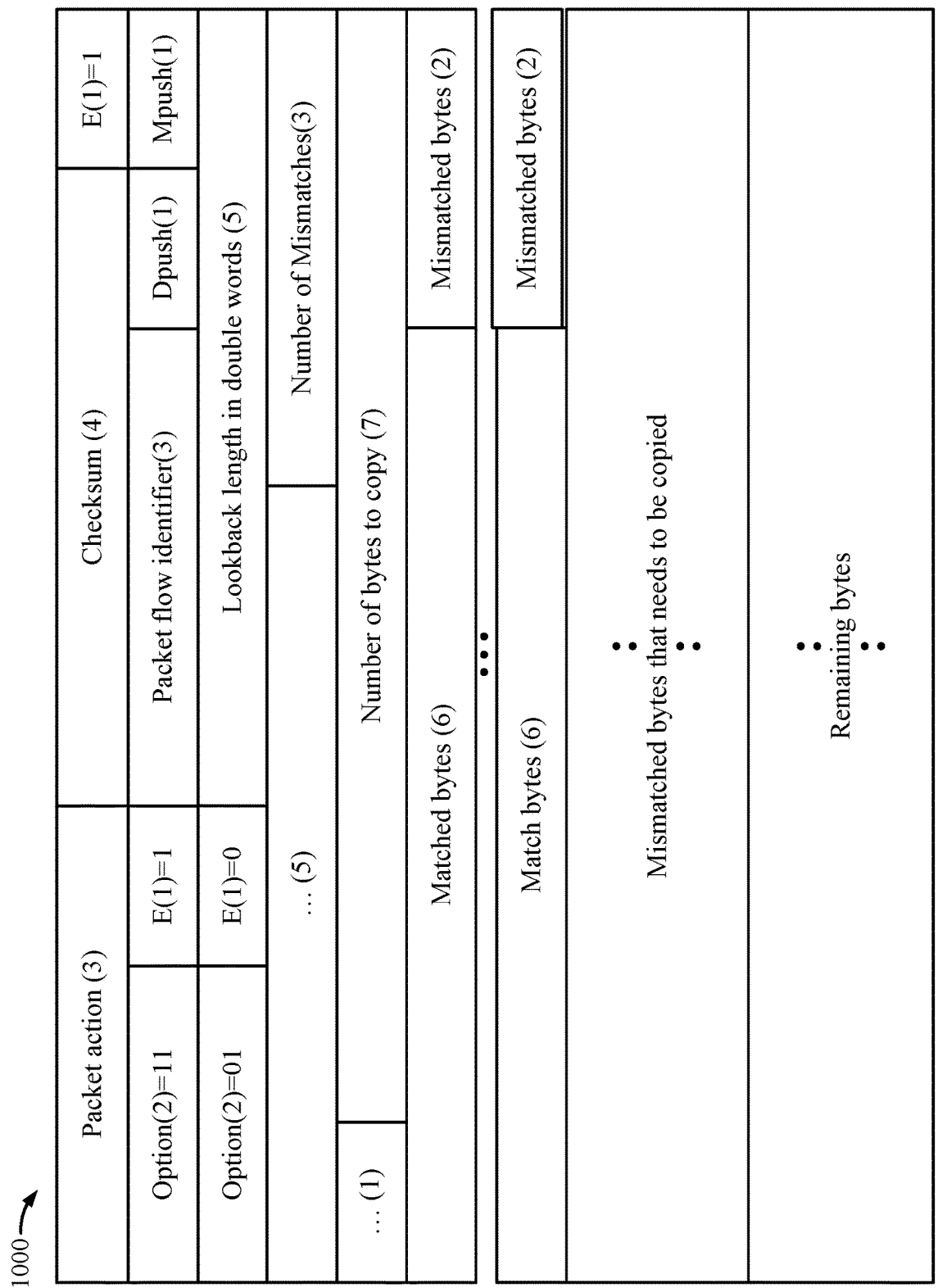
FIG. 10 illustrates an example of an enhanced UDC packet format including push and packet flow indications, in accordance with certain aspects of the present disclosure.

According to certain aspects, further enhancements to UDC formats may include indicating push and/or packet flow. FIG. 10 illustrates an example of an enhanced UDC packet format 1000 with push and packet flow indications, in accordance with certain aspects of the present disclosure. As shown in FIG. 10, the enhanced UDC packet format 1000 may include an Option field indicating the header type (e.g., a value of 11 may indicate Push). The DPush field may indicate that the packet is to be pushed to the UL Compression Memory. In this case, the Packet action field may indicate header only or full packet. The MPush field may indicate that metadata of the header (e.g., short UDC header or conventional full UDC header) is to be pushed to the UL Compression Memory. This may include pushing metadata explicitly included in the current packet as well as metadata which are referred to from previous packets. The Packet Flow Identifier field may indicate one of eight IP flows, for example, indicating that packet and metadata corresponding to the identified flow is to be pushed into and read from the memory.

According to certain aspects, previous packets for any of the above-described techniques can be maintained per traffic flow to increase the matching bytes. In this case, the compression may be done with respect to any of the prior packets in the same flow or, preferably, with the last packet of the same flow. In this case, a separate memory may be used for each flow.

FIG. 11 illustrates an example of an enhanced UDC packet format 1100 with PICR and UDC, in accordance with certain aspects of the present disclosure. As shown in FIG. 11, matched metadata may be interleaved with mismatched metadata. In this case, matched references should be followed by UDC headers.

According to certain aspects, use of the enhanced compression techniques and formats described above may be applied to any packet compression scenario with UDC as one example. Use of the enhanced compression techniques and formats may increase compression gains.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. For example, operations 400 illustrated in FIG. 4 correspond to means 400A illustrated in FIG. 4A.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing, means for determining, means for assigning, means for including, means for storing, means for indexing, meaning for tagging, means for indicating, and means for compressing may comprise a processing system, which may include one or more processors, such as the RX data processor 270, the TX data processor 288, and/or the controller 280 of the user terminal 120 illustrated in FIG. 2.

According to certain aspects, such means may be implemented by processing systems configured to perform the corresponding functions by implementing various algorithms (e.g., in hardware or by executing software instructions) described above for providing an immediate response indication in a PHY header. For example, an algorithm for determining one or more blocks of data in a current packet matching one or more blocks of data in one or more portions of one or more previous packets stored in a memory, an algorithm for compressing at least a portion of the current packet based on an enhanced UDC format having reduced metadata relative to another UDC format to indicate one or more of the matching blocks of data, and an algorithm for transmitting the compressed current packet.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for determining one or more blocks of data in a current packet matching one or more blocks of data in one or more portions of one or more previous packets stored in a memory, instructions for compressing at least a portion of the current packet based on an enhanced UDC format having reduced metadata relative to another UDC format to indicate one or more of the matching blocks of data, and instructions for transmitting the compressed current packet.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless communications, comprising:
   determining one or more blocks of data in a current packet matching one or more blocks of data in one or more portions of one or more previous packets stored in a memory;
   compressing at least a portion of the current packet based on an enhanced compression format having reduced metadata relative to another compression format to indicate one or more of the one or more blocks of data in the current packet, wherein compressing the at least a portion of the current packet based on the enhanced compression format comprises including, in the current packet, a pointer to a memory location of a stored compression header of a previous packet, and wherein the stored compression header of the previous packet includes a pointer to a memory location of the matching one or more blocks of data; and
   transmitting the current packet including the compressed portion and the pointer to the memory location of the stored compression header.

2. The method of claim 1, wherein the enhanced compression format comprises enhanced uplink data compression (UDC).

3. The method of claim 1, further comprising:
   compressing another portion of the current packet based on the other compression format to indicate other matching blocks of data.

4. The method of claim 1, wherein the previous packet is a packet immediately preceding the current packet.

5. The method of claim 1, wherein:
   the stored compression header of the previous packet points to blocks of data that fully matches the one or more blocks of data of the current packet, and
   compressing the at least a portion of the current packet based on the enhanced compression format comprises indicating in a packet action field in the current packet to reuse the stored compression header of the previous packet.

6. The method of claim 5, wherein the current packet does not include a compression header.

7. The method of claim 1, wherein the stored compression header comprises a short compression header having reduced metadata relative to a compression header of the other compression format.

8. The method of claim 1, further comprising:
   storing compression headers of a plurality of previously transmitted packets in the memory;
   assigning template identifiers (IDs) to the stored compression headers;
   wherein compressing the current packet based on the enhanced compression format comprises indicating the template IDs of the stored compression headers in the current packet.

9. The method of claim 1, wherein compressing the at least a portion of the current packet based on the enhanced compression format comprises:
including, in the current packet, a short compression header having reduced metadata relative to a compression header of the other compression format.

10. The method of claim 1, further comprising:
each time a new packet is stored in the memory, updating at least one of a lookback location or an absolute pointer associated with each of the one or more previous packets stored in the memory.

11. The method of claim 1, wherein compressing the current packet based on the enhanced compression format comprises at least one of:
including an indication in the current packet that the current packet should be stored in the memory,
including an indication in the current packet that metadata associated with the current packet should be stored in the memory, or
including an indication in the current packet of a flow for which the current packet and metadata associated with the current packet should be stored in the memory.

12. The method of claim 1, wherein the current packet including the compressed portion includes at least one extension bit that indicates the enhanced compression format used to compress the at least a portion.

13. The method of claim 1, wherein the current packet including the compressed portion includes an indication of mismatched bytes after all compression headers according to an ordering of the compression headers associated with the mismatched bytes.

14. The method of claim 1, wherein the current packet including the compressed portion includes an indication of mismatched bytes associated with a compression header immediately after the compression header.

15. An apparatus for wireless communications, comprising:
means for determining one or more blocks of data in a current packet matching one or more blocks of data in one or more portions of one or more previous packets stored in a memory;
means for compressing at least a portion of the current packet based on an enhanced compression format having reduced metadata relative to another compression format to indicate one or more of the one or more blocks of data in the current packet, wherein compressing the at least a portion of the current packet based on the enhanced compression format comprises including, in the current packet, a pointer to a memory location of a stored compression header of a previous packet and wherein the stored compression header of the previous packet includes a pointer to a memory location of the matching one or more blocks of data; and
means for transmitting the current packet including the compressed portion and the pointer to the memory location of the stored compression header.

16. An apparatus for wireless communications, comprising:
at least one processor coupled with a memory and configured to:
determine one or more blocks of data in a current packet matching one or more blocks of data in one or more portions of one or more previous packets stored in a memory; and
compress at least a portion of the current packet based on an enhanced compression format having reduced metadata relative to another compression format to indicate one or more of the one or more blocks of data in the current packet, wherein compressing the at least a portion of the current packet based on the enhanced compression format comprises including, in the current packet, a pointer to a memory location of a stored compression header of a previous packet, and wherein the stored compression header of the previous packet includes a pointer to a memory location of the matching one or more blocks of data; and
a transmitter configured to transmit the current packet including the compressed portion and the pointer to the memory location of the stored compression header.

17. A non-transitory computer readable medium having computer executable code stored thereon, comprising:
code for determining one or more blocks of data in a current packet matching one or more blocks of data in one or more portions of one or more previous packets stored in a memory;
code for compressing at least a portion of the current packet based on an enhanced compression format having reduced metadata relative to another compression format to indicate one or more of the one or more blocks of data in the current packet, wherein compressing the at least a portion of the current packet based on the enhanced compression format comprises including, in the current packet, a pointer to a memory location of a stored compression header of a previous packet and wherein the stored compression header of the previous packet includes a pointer to a memory location of the matching one or more blocks of data; and
code for transmitting the current packet including the compressed portion and the pointer to the memory location of the stored compression header.

* * * * *